US010460782B1

(12) United States Patent
Huang

(10) Patent No.: US 10,460,782 B1
(45) Date of Patent: Oct. 29, 2019

(54) INTEGRATED CIRCUITS HAVING SINGLE STATE MEMORY REFERENCE CELLS AND METHODS FOR OPERATING THE SAME

(71) Applicant: GLOBALFOUNDRIES, Inc., Grand Cayman (KY)

(72) Inventor: Yentsai Huang, Malta, NY (US)

(73) Assignee: GLOBALFOUNDARIES INC., Grand Cayman (KY)

( * ) Notice: Subject to any disclaimer, the term of this patent is extended or adjusted under 35 U.S.C. 154(b) by 0 days.

(21) Appl. No.: 16/055,952

(22) Filed: Aug. 6, 2018

(51) Int. Cl.
*G11C 11/00* (2006.01)
*G11C 11/16* (2006.01)
*G06F 11/07* (2006.01)
*G11C 13/00* (2006.01)

(52) U.S. Cl.
CPC ...... *G11C 11/1659* (2013.01); *G06F 11/0727* (2013.01); *G11C 11/1655* (2013.01); *G11C 11/1657* (2013.01); *G11C 11/1673* (2013.01); *G11C 13/004* (2013.01)

(58) Field of Classification Search
CPC ............ G11C 11/1673; G11C 13/004; G11C 11/1675; G11C 13/0069; G11C 11/16; G11C 11/1693; G11C 2013/0054; G11C 11/1655; G11C 11/1659; G11C 13/0026; G11C 13/0061; G11C 2213/79
USPC .. 365/158, 148, 171, 189.07, 210.1, 189.15, 365/207, 145, 185.17, 185.21, 189.05, 365/189.09, 189.16
See application file for complete search history.

(56) References Cited

U.S. PATENT DOCUMENTS

| 9,697,880 | B2 | 7/2017 | Andre et al. |
| 9,715,419 | B2 | 7/2017 | Kinney et al. |
| 2006/0227598 | A1* | 10/2006 | Sakimura ................ G11C 11/15 365/158 |
| 2018/0137913 | A1* | 5/2018 | Kim ...................... G11C 13/004 |

OTHER PUBLICATIONS

Na et al., "An Offset-Tolerant Dual-Reference-Voltage Sensing Scheme for Deep Submicrometer STT-RAM", IEEE Transactions on Very Large Scale Integration (VLSI) Systems, Apr. 2016, pp. 1361-1370, vol. 24, No. 4.
Park et al., "A novel sensing algorithm for Spin-Transfer-Torque magnetic RAM (STT-MRAM) by utilizing dynamic reference", IEICE Electronics Express, Feb. 10, 2012, pp. 153-159, vol. 9, No. 3.

* cited by examiner

*Primary Examiner* — Thong Q Le
(74) *Attorney, Agent, or Firm* — Yee Tze Lim; Hoffman Warnick LLC

(57) ABSTRACT

Integrated circuits including memory cells and methods for operating memory cells are provided. In an embodiment, a method is provided for operating a memory including a plurality of operational memory cells. The method includes providing a word line voltage on a selected word line corresponding to a selected operational memory cell of the plurality of operational memory cells and to a corresponding reference memory cell. The method includes applying an operational bias current on an operational bit line to the selected operational memory cell. Also, the method includes scanning a reference bias current from a first value to a second value on a reference bit line to the reference memory cell. Further, the method includes comparing reference cell currents on the reference bit line with an operational cell current on the operational bit line to determine a logic state of the selected operational memory cell.

20 Claims, 4 Drawing Sheets

INTEGRATED CIRCUITS HAVING SINGLE STATE MEMORY REFERENCE CELLS AND METHODS FOR OPERATING THE SAME

TECHNICAL FIELD

The technical field generally relates to integrated circuits with memory cells, and more particularly relates to circuits and methods for operating memory cells.

BACKGROUND

Read errors can occur in various types of memory, such as magneto-resistive random access memory (MRAM). MRAM is a form of non-volatile memory in which data can be stored by adjusting a resistance in a magnetic tunneling junction (MTJ) of a memory cell. For instance, the resistance of an MTJ can be switched between a high resistance state and a low resistance state. In an MRAM, a current induced magnetic field can switch the magnetization of the MTJ to switch between states.

Certain types of memory can encounter relatively high read error rates. Such error rates can be caused by several different sources or mechanisms or non-uniformities in the memory. Due to non-uniformities in manufacturing, different memory cells in the same memory array may not be matched with each other. For instance, in some MRAMs that store binary states, the variability in the memory cells can cause a relatively high variation in the distribution in resistance for both the low resistance states and high resistance states for memory cells in the same memory array.

Current methods for reading memory may have difficulty in measuring MRAM read margin. Also, current methods for reading memory may rely on a complicated reference cell set/reset operation. Certain methods for reading memory utilize multiple fixed reference cells and complicate the identification of distribution tail reference bits. Also, current methods may be hindered by reference cell disturb failures.

In view of the foregoing, it is desirable to provide an improved integrated circuit and method for operating memory, as compared to conventional devices. Furthermore, it is also desirable to provide methods for operating memory in which only a single state reference cell is utilized. Furthermore, other desirable features and characteristics will become apparent from the subsequent detailed description and the appended claims, taken in conjunction with the accompanying drawings and this background.

BRIEF SUMMARY

Integrated circuits including memory cells and methods for operating memory cells are provided. In an embodiment, a method is provided for operating a memory including a plurality of operational memory cells. The method includes providing a word line voltage on a selected word line corresponding to a selected operational memory cell of the plurality of operational memory cells and to a corresponding reference memory cell. The method includes applying an operational bias current on an operational bit line to the selected operational memory cell. Also, the method includes scanning a reference bias current from a first value to a second value on a reference bit line to the reference memory cell. Further, the method includes determining a logic state of the selected operational memory cell by comparing reference cell currents on the reference bit line with an operational cell current on the operational bit line to determine a logic state of the selected operational memory cell.

In another embodiment, a method for reading data from a memory cell includes applying an operational bias current on an operational bit line to the memory cell. Further, the method includes scanning a reference bias current from a first value to a second value on a reference bit line to a reference memory cell. The method also includes comparing reference cell currents on the reference bit line with an operational cell current on the operational bit line.

In another embodiment, an integrated circuit is provided. The integrated circuit includes a plurality of operational magneto-resistive random access memory (MRAM) cells arranged in an array of rows and columns. Also, the integrated circuit includes a plurality of read circuits. Each read circuit is associated with a respective MRAM cell. Each read circuit includes an operational power supply node coupled to an operational ground node by an operational bit line, wherein each respective operational MRAM cell is coupled to the operational bit line between the operational power supply node and the operational ground node. Also, each read circuit includes a reference power supply node coupled to a reference ground node by a reference bit line. Further, each read circuit includes a reference memory cell coupled to the reference bit line between the reference power supply node and the reference ground node. Each read circuit also includes a sense amplifier coupled to the operational bit line between the operational power supply node and the selected operational memory cell and coupled to the reference bit line between the reference power supply node and the reference memory cell.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
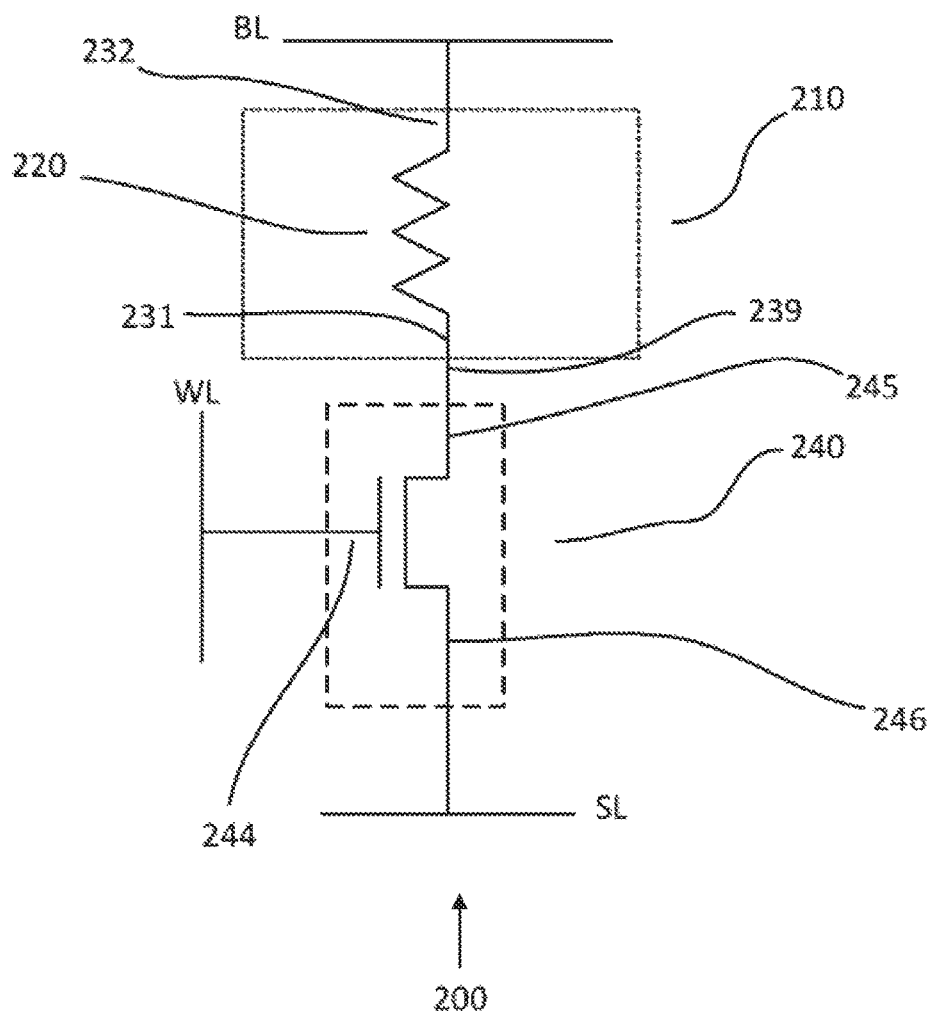
FIG. 1 is a simplified schematic diagram of an exemplary memory cell.

The following detailed description is merely exemplary in nature and is not intended to limit the integrated circuits including memory cells and methods for operating memory cells. Furthermore, there is no intention to be bound by any expressed or implied theory presented in the preceding technical field, background or brief summary, or in the following detailed description.

For the sake of brevity, conventional techniques related to conventional integrated circuit device design and fabrication may not be described in detail herein. Moreover, the various tasks and processes described herein may be incorporated into a more comprehensive procedure or process having additional functionality not described in detail herein. In particular, various techniques in semiconductor design and fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when a first element or layer is referred to as being "over" or "under" a second element or layer, the first element or layer may be directly on the second element or layer, or intervening elements or layers may be present. When a first element or layer is referred to as being "on" a second element or layer, the first element or layer is directly on and in contact with the second element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operational in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Embodiments of the present disclosure generally relate to methods and structures for reading magneto-resistive memory cells, such as magneto-resistive random access memory (MRAM) cells, including spin transfer torque magneto-resistive random access memory (STT-MRAM) cells.

FIG. 1 is a simplified schematic diagram of an embodiment of a memory cell 200. The memory cell 200 is a non-volatile memory cell, for example, a magneto-resistive memory cell, such as a spin transfer torque-magneto-resistive random access memory (STT-MRAM) cell. Other suitable types of memory cells may also be useful. As shown, the memory cell 200 includes a magnetic storage unit 210 and a cell selector unit 240. The magnetic storage unit 210 is coupled to the cell selector unit 240 at a first cell node 239 of the memory cell 200. The exemplary magnetic storage unit 210 includes a magnetic tunnel junction (MTJ) element 220.

The exemplary MTJ element 220 includes a first electrode 231 and a second electrode 232. The first electrode 231, for example, may be a bottom electrode while the second electrode 232 may be a top electrode. Other configurations of electrodes may also be useful. In one embodiment, the top electrode 232 of the MTJ element 220 is electrically connected to a bit line BL and the bottom electrode 231 is electrically connected to the first cell node 239.

In FIG. 1, the exemplary cell selector unit 240 is an access transistor for selecting the memory cell 200. In one embodiment, the access transistor 240 is a metal oxide semiconductor (MOS) transistor, such as an n-type MOS transistor, and includes a gate or control terminal 244, a first source/drain (S/D) terminal 245, and a second source/drain (S/D) terminal 246. The first S/D terminal 245 may be referred to as the drain and the second S/D terminal 246 may be referred to as the source. The access transistor 240 may be a planar device, such as planar semiconductor-over-insulator (SOI) device, access transistor 240 may also be formed as a FINFET device, a gate all around (GAA) device, or with another suitable structure.

In an embodiment, the first S/D terminal 245 of the access transistor 240 and first electrode 231 of the MTJ element 220 are commonly coupled at the first cell node 239, i.e., the drain terminal 245 of the access transistor 240 is coupled to the bottom electrode 231 of the MTJ element 220. In such embodiment, the second or source terminal 246 of the access transistor 240 is coupled to a source line SL while the gate terminal 244 is coupled to a word line WL.

Figure 2:
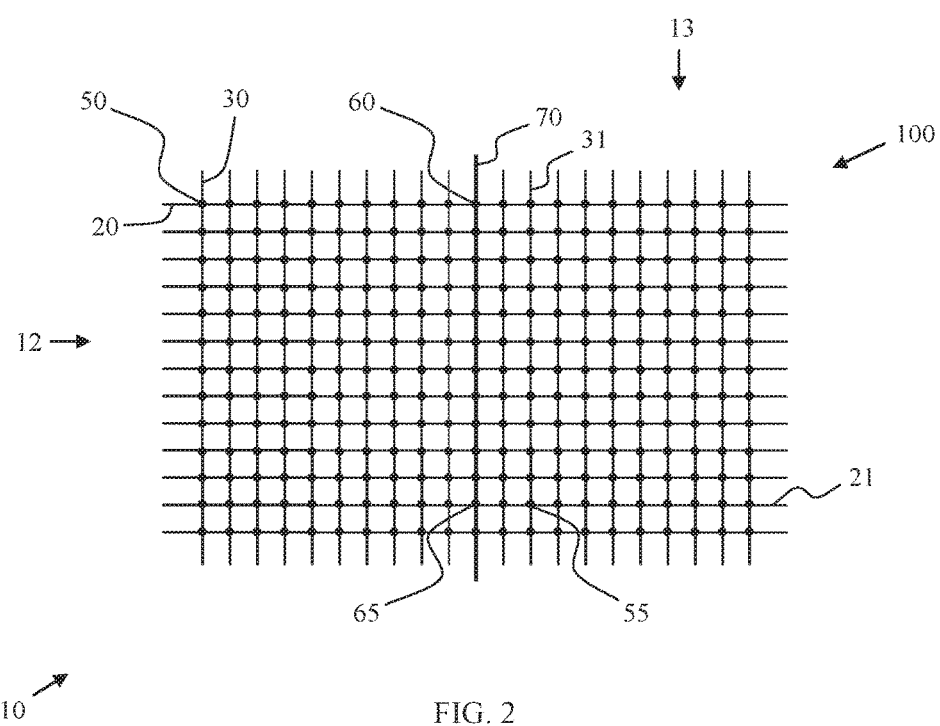
FIG. 2 is a simplified schematic diagram of an exemplary array of memory cells.

FIG. 2 shows a simplified schematic view of an embodiment of an array 10 of operational or data memory cells 50 and reference cells 60 for use in an integrated circuit 100. The operational memory cells 50 and reference cells 60 may be structurally identical to one another and fabricated according to the same methods. For example, the operational memory cells 50 and reference cells 60 may be identical or similar to exemplary cell 200 of FIG. 1.

As shown in FIG. 2, each operational memory cell 50 is located at the intersection of a word line 20 and an operational or data bit line 30. As is conventional, the word lines 20 are illustrated as being laid out in horizontal rows 12 while the operational bit lines 30 are illustrated as being laid out in vertical columns 13. Other arrangements may be useful.

In FIG. 2, the reference cells 60 are provided as a column 14. Each reference cell 60 is coupled to a reference bit line 70 that is parallel to operational bit lines 30. As shown, each reference cell 60 is located at the intersection of a word line 20 and the reference bit line 70. In the embodiment of FIG. 2, the column 14 of reference cells 60 is located in the middle of the columns of operational memory cells 50. For example, from about 40% to about 60% of the total number of columns 13 of operational memory cells 50 are located to the left of the column 14 of reference cells 60 and from about 60% to about 40% of the total number of columns 13 of operational memory cells 50 are located to the right of the column 14 of reference cells 60.

As is well understood, for a read operation, a specific operational memory cell 55 may be selected from the array 10 of memory cells 50 by applying a word line voltage to the gates of each memory cell 50 in a selected word line 21 corresponding to the selected operational memory cell 55. In the exemplary embodiment, the word line voltage is also applied to the gate of a corresponding reference memory cell 65 coupled to the selected word line 21. Further, an operational bias current is applied to the operational bit line 31 corresponding to the selected operational memory cell 55. Further description of the read operation continues below after description of the read circuit for performing the read operation.

Figure 3:
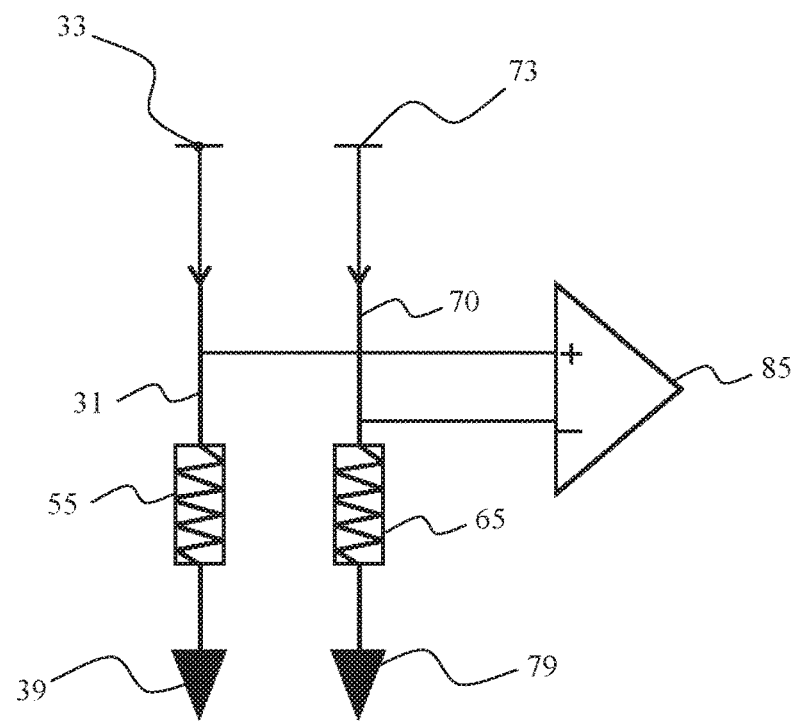
FIG. 3 is a schematic diagram of an embodiment of a read circuit for operating a memory cell.

Referring now to FIG. 3, a read circuit 80 is illustrated for performing a read operation on a selected operational memory cell 55 as depicted in FIG. 2. In FIG. 3, an operational power supply node 33 is coupled to an operational ground node 39 by the selected operational bit line 31. As shown, the selected operational memory cell 55 is coupled to the operational bit line 31 between the operational power supply node 33 and the operational ground node 39.

As further illustrated in FIG. 3, the reference bit line 70 is coupled to a reference power supply node 73 and to a reference ground node 79. As shown, the reference memory cell 65, corresponding to, i.e., in the same row as, selected operational memory cell 55, is illustrated and is coupled to the reference bit line 70 between the reference power supply node 73 and the reference ground node 79.

In FIG. 3, the read circuit further includes a sense amplifier 85. The exemplary sense amplifier 85 is coupled to the operational bit line 31 between the operational power supply node 33 and the selected operational memory cell 55. Further, the exemplary sense amplifier 85 is coupled to the reference bit line 70 between the reference power supply node 73 and the reference memory cell 79.

Thus, a selected read circuit 80 includes a selected operational memory cell 55 and the associated operational bit line 31 and operational power supply node 33 and operational ground node 39. Further, the selected read circuit 80 includes the reference bit line 70, reference power supply node 73, reference ground node 79, reference memory cell 65, and sense amplifier 85.

Cross-referencing FIGS. 2 and 3, it is noted that a single reference memory cell 60 may be provided for each row of operational memory cells 50 (and each word line associated therewith). Thus, the read circuit formed for each operational memory cell 50 in a row includes the same reference memory cell 60. Further, it is noted that each read circuit includes only two memory cells: the selected operational memory cell 55, and the reference memory cell 65 associated with that selected operational memory cell 55, i.e., in the same row as that selected operational memory cell 55. Thus, each read circuit consists of two memory cells.

It is noted that the selected operational memory cell 55 is representative of all bit lines 30. Specifically, each bit line 30 of the array 10 of FIG. 2 is provided with a read circuit 80 as described in relation to FIG. 3. More specifically, each bit line 30 of array 10 is provided with an operational power supply node 33, operational ground node 39, and is coupled to a shared sense amplifier 85. Further, a reference cell 65 is shared by each operational memory cell 50 in a same row 12. Also, a single reference bit line 70, reference power supply node 73, reference ground node 79, and sense amplifier 85 are shared by each operational memory cell 50 in the array 10. For example, the reference power supply node 73, reference ground node 79, and sense amplifier 85 may be multiplexed to each operational memory cell 55.

As indicated above, a read operation includes activating a selected word line 21 (by providing a word line voltage thereon) and a selected bit line 31 (by applying an operational bias current thereon) to select the operational memory cell 55 addressed by the selected word line 21 and the selected bit line 31. The method further includes scanning a reference bias current from a first value to a second value on the reference bit line 60 to the reference memory cell 65 associated with the selected operational memory cell 55. The sense amplifier 85 receives an operational cell current on the selected bit line and reference cell currents on the reference bit line. The method further includes comparing the reference cell currents on the reference bit line with an operational cell current on the operational bit line to determine a logic state of the selected operational memory cell.

Figure 4:
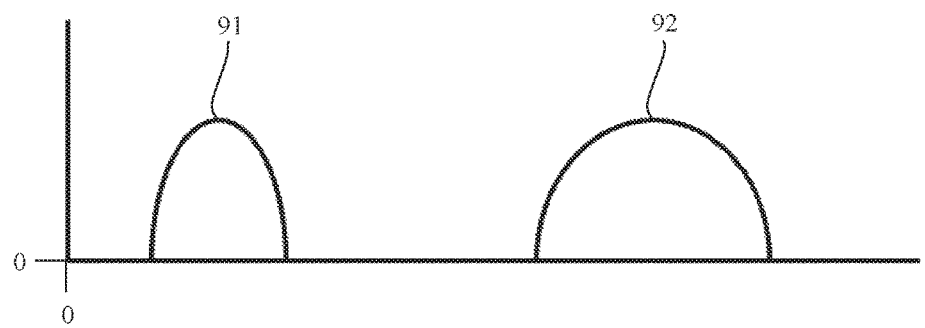
FIG. 4 is a graph of resistance distribution for an MRAM cell.
Figure 5:
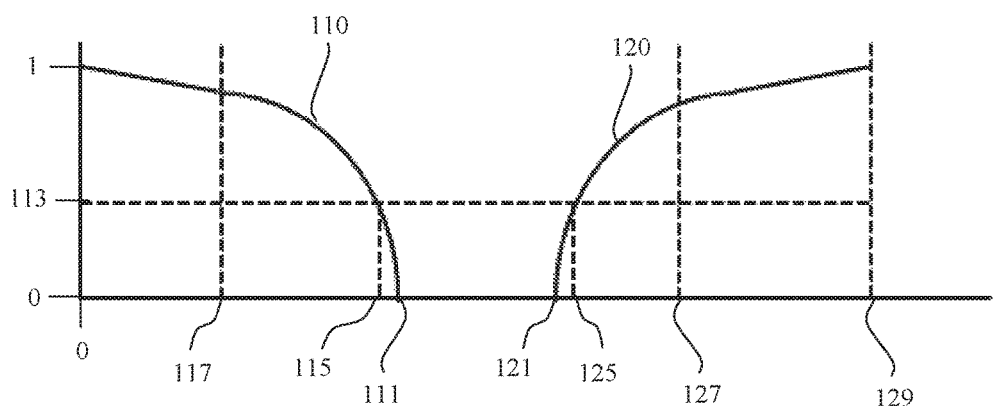
FIG. 5 is a graph illustrating the bit error rate of a memory cell as read currents are scanned.

Referring to FIGS. 4 and 5, such comparison is illustrated. FIG. 4 is a graph illustrating the resistance distribution for an MRAM cell in parallel and anti-parallel states. The X-axis is resistance and increases from the origin at 0. The Y-axis is the population or number of MRAM elements associated with the resistance of a corresponding magnitude and increases from the origin at 0. The resistance distribution for the parallel (Rp) state is indicated by the curve 91. The resistance distribution for the anti-parallel state (Rap) is indicated by the curve 92.

Referring now to FIG. 5, the graph illustrates how the read current applied to a reference cell can be scanned to determine the read margin of a memory cell. In FIG. 5, the X-axis represents the read current (Ir) applied and increases from the origin at 0. The Y-axis represents the bit error rate (BER) and increases from the origin at 0.

A first curve 110 illustrates a first scan of a read current Ir that is initiated at a first value 111 that is between a nominal parallel data state current and a nominal anti-parallel data state current. For example, the nominal parallel data state current can be the mean current (Id) of curve 110, which can be used to deduce mean Rp, and the nominal anti-parallel data state current can be the mean current (Id) of curve 120, which can be used to deduce mean Rap. At the first value 111, the BER is 0. As the read current Ir is decreased, the BER increases, and reaches 1 when the read current Ir equals 0. Curve 110 is indicative of the state when storage node Q=0.

As shown, a target BER is indicated at 113. The target BER 113 intersects the curve 110 at the read current for the parallel state (Ir_P) 115. Also shown is the mean current (Id) 117 of curve 110.

A second curve 120 illustrates a second scan of a read current Ir that is initiated at a first value 121 that is between the nominal parallel data state current and the nominal anti-parallel data state current. At the first value 121, the BER is 0. As the read current Ir is increased, the BER increases and reaches 1 when the read current Ir equals a maximum current (I_max) 129. Curve 120 is indicative of the state when storage node Q=1.

As shown, the target BER 113 intersects the curve 120 at the read current for the anti-parallel state (Ir_AP) 125. Also shown is the value 127, which is equal to Id*(TMR+1) wherein TMR is the tunnel magnetoresistance. Values 117 and 127 can be used to deduce mean Rp and Rap. The difference between value 121 and value 111 is the read margin while BER is 0. The difference between value 125 and value 115 is the read margin at the target BER. Read margin equals the difference of the anti-parallel read current (Ir_AP) and the parallel read current (Ir_P), i.e., read margin=Ir_AP−Ir_P.

To determine a logic state of a selected operational memory cell, reference cell currents on the reference bit line are compared with an operational cell current on the operational bit line. For example, a selected operational memory cell may be in the anti-parallel state (Rap). Assuming the reference memory cell is also in the antiparallel state, scanning a read current Ir from value 111 to zero would result in a BER of 0. Scanning a read current from value 121 to value 129 would produce a curve similar to curve 120, thus indicating that the selected operational memory cell is in the anti-parallel state (Rap). During a scanning procedure, the reference bit is fixed, and can be pre-set at either the parallel or anti-parallel state. The data bias current is also fixed. The procedure includes pre-programming all data bits to parallel state then scanning the read current Ir to generate curve 110. Then, the procedure pre-programs all data bits to anti-parallel state and scans the read current Ir to generate curve 120. By setting the reference current at any point between 111 and 121, data bit states can be correctly compared with BER=0 requirement. By setting the reference current at any point between 115 and 125, data bit states can be correctly compared with expected BER 113 criteria. The method may include first setting the reference memory cells to a first logic state before scanning the reference bias current from the first value to the second value.

Thus, it may be seen that a method for operating the memory cell may include scanning the reference bias current from the first value to the second value by increasing the reference bias current from the first value to the second value and/or by decreasing the reference bias current from the first value to the second value. In either case, the exemplary first value is between a nominal parallel data state current and a nominal anti-parallel data state current.

The present disclosure may be embodied in other specific forms without departing from the spirit or essential characteristics thereof. The foregoing embodiments, therefore, are to be considered in all respects illustrative rather than limiting. The scope of the subject matter is thus indicated by the appended claims, rather than by the foregoing description, and all changes that come within the meaning and range of equivalency of the claims are intended to be embraced therein.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof

What is claimed is:

1. A method for operating a memory including a plurality of operational memory cells, the method comprising:
    providing a word line voltage on a selected word line corresponding to a selected operational memory cell of the plurality of operational memory cells and to a corresponding reference memory cell;
    applying an operational bias current on an operational bit line to the selected operational memory cell;
    while maintaining the operational bias current at a constant value, scanning a reference bias current from a first value to a second value on a reference bit line to the reference memory cell; and
    determining a logic state of the selected operational memory cell by comparing reference cell currents on the reference bit line with an operational cell current on the operational bit line to determine a logic state of the selected operational memory cell.

2. The method of claim 1 wherein scanning the reference bias current from the first value to the second value comprises increasing the reference bias current from the first value to the second value.

3. The method of claim 1 wherein scanning the reference bias current from the first value to the second value comprises decreasing the reference bias current from the first value to the second value.

4. The method of claim 1 wherein the first value is between a nominal parallel data state current and a nominal anti-parallel data state current.

5. The method of claim 1 wherein the reference memory cell is selected from a plurality of reference memory cells, and wherein the method further comprises setting the reference memory cells to a first logic state before scanning the reference bias current from the first value to the second value.

6. The method of claim 1 wherein the operational memory cells and the reference memory cell are magneto-resistive random access memory (MRAM) cells.

7. The method of claim 1 wherein the memory includes a read circuit comprising:
    an operational power supply node coupled to an operational ground node by the operational bit line, wherein the selected operational memory cell is coupled to the operational bit line between the operational power supply node and the operational ground node;
    a reference power supply node coupled to a reference ground node by the reference bit line, wherein the reference memory cell is coupled to the reference bit line between the reference power supply node and the reference ground node; and
    a sense amplifier coupled to the operational bit line between the operational power supply node and the selected operational memory cell and coupled to the reference bit line between the reference power supply node and the reference memory cell.

8. The method of claim 7 wherein the read circuit includes only two memory cells consisting of the selected operational memory cell and the reference memory cell.

9. A method for reading data from a memory cell, the method comprising:
    applying an operational bias current on an operational bit line to the memory cell;
    while maintaining the operational bias current at a constant value, scanning a reference bias current from an initial value through intermediate values to an end value on a reference bit line to a reference memory cell; and
    comparing reference cell currents on the reference bit line with an operational cell current on the operational bit line.

10. The method of claim 9 further comprising measuring read margin of the memory cell.

11. The method of claim 9 wherein comparing the reference cell currents on the reference bit line with the operational cell current on the operational bit line comprises determining a logic state of the selected operational memory cell.

12. The method of claim 9 wherein scanning the reference bias current from the initial value through the intermediate values to the end value comprises increasing the reference bias current from the f initial value to the end value.

13. The method of claim 9 wherein scanning the reference bias current from the initial value through the intermediate values to the end value comprises decreasing the reference bias current from the initial value to the end value.

14. The method of claim 9 wherein the initial value is between a nominal parallel data state current and a nominal anti-parallel data state current.

15. The method of claim 9 further comprising setting the reference memory cell to a first logic state before scanning the reference bias current from the initial value to the end value.

16. The method of claim 9 wherein the memory cell and the reference memory cell are magneto-resistive random access memory (MRAM) cells.

17. The method of claim 9 wherein the memory cell is coupled to a read circuit comprising:
    an operational power supply node coupled to an operational ground node by the operational bit line, wherein the memory cell is coupled to the operational bit line between the operational power supply node and the operational ground node;

a reference power supply node coupled to a reference ground node by the reference bit line, wherein the reference memory cell is coupled to the reference bit line between the reference power supply node and the reference ground node; and a sense amplifier coupled to the operational bit line between the operational power supply node and the selected operational memory cell and coupled to the reference bit line between the reference power supply node and the reference memory cell for comparing the reference cell currents on the reference bit line with the operational cell current on the operational bit line.

18. The method of claim 17 wherein the read circuit includes only two memory cells consisting of the memory cell and the reference memory cell.

19. An integrated circuit comprising:

a plurality of operational magneto-resistive random access memory (MRAM) cells arranged in an array of rows and columns; and a plurality of read circuits, wherein each read circuit is associated with a respective MRAM cell and comprises:

an operational power supply node coupled to an operational ground node by an operational bit line, wherein each respective operational MRAM cell is coupled to the operational bit line between the operational power supply node and the operational ground node;

a reference power supply node coupled to a reference ground node by a reference bit line, wherein the reference power supply node is independent of the operational power supply node to apply a constant operational bias current to the operational bit line while a reference bias current is applied to the reference bit line and is scanned from an initial value through intermediate values to an end value;

a reference memory cell coupled to the reference bit line between the reference power supply node and the reference ground node; and a sense amplifier coupled to the operational bit line between the operational power supply node and the selected operational memory cell and coupled to the reference bit line between the reference power supply node and the reference memory cell.

20. The integrated circuit of claim 19, wherein each read circuit consists of one reference memory cell.

* * * * *